United States Patent [19]

Chan et al.

[11] Patent Number: 4,851,711

[45] Date of Patent: Jul. 25, 1989

[54] ASYMMETRICAL CLOCK CHOPPER DELAY CIRCUIT

[75] Inventors: Yuen H. Chan, Poughkeepsie; Rolf H. Nijhuis, Pleasant Valley; Carlos G. Rivadeneira, Wappingers Falls; James R. Struk, Poughkeepsie, all of N.Y.

[73] Assignee: International Business Machines Corporation, Armonk, N.Y.

[21] Appl. No.: 151,381

[22] Filed: Feb. 2, 1988

[51] Int. Cl.⁴ .................. H03K 3/286; H03K 19/013
[52] U.S. Cl. ................................ 307/288; 307/269; 307/292
[58] Field of Search .............. 307/247.1, 292, 280, 307/319, 269, 288; 377/120, 122

[56] References Cited

U.S. PATENT DOCUMENTS 3,165,647  1/1965  DeBotiari et al. ............... 377/122
3,351,784  11/1967  McNulty et al. ................. 307/280
4,355,245  10/1982  Isugai ............................... 307/280

OTHER PUBLICATIONS

IBM Tech. Discl. Bul. vol. 29, No. 7 12/1986 pp. 3148-3151.

IBM Journal by Dorler et al, vol. 25, No. 3, May 1981, pp. 126-134.

Primary Examiner—John S. Heyman
Attorney, Agent, or Firm—John D. Crane

[57] ABSTRACT

An asymmetrical delay generator for use in a clock chopping circuit is disclosed. The circuit has a complementary transistor switch memory cell in it. That cell is operated in a mode where one half of the cell operates in saturation mode. That half of the cell controls the pulse width of the chopper. The other half of the cell is not operated in saturation and controls the resetting of the chopper and hence the maximum clock rate at which the circuit will operate.

4 Claims, 3 Drawing Sheets

ASYMMETRICAL DELAY GENERATOR

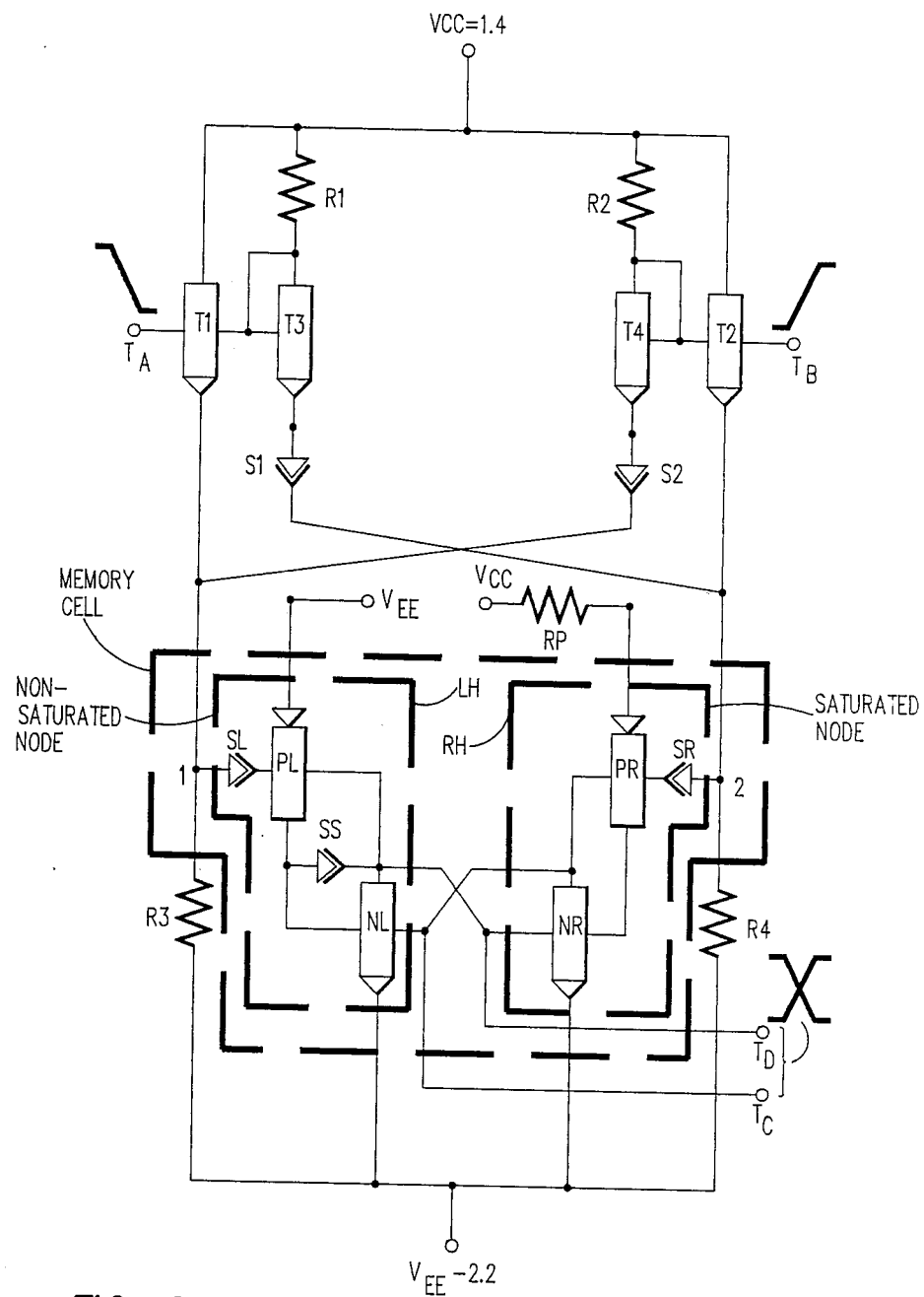
FIG. 2  ASYMMETRICAL DELAY GENERATOR

CLOCK CHOPPER SWITCHING WAVEFORM

ASYMMETRICAL CLOCK CHOPPER DELAY CIRCUIT

The present invention relates to a digital logic timing circuit and particularly to a clock chopper circuit.

In digital logic systems utilizing a large number of boards or cards for mounting a plurality of integrated circuits, master clock signals are frequently generated by a common clock generator circuit. The clock pulses produced thereby are distributed throughout the logic system. These clock pulses provide timing signals at a particular time within the repetitive clock cycle provided by a master system clock. The clock pulses, however, may not be suitable for the purpose of controlling the operation of the circuits on a given chip. Hence, a clock chopper may be required on the chip to produce from the system clock pulses input thereto, a suitable set of on chip clock pulses.

Clock chopper circuits are quite widely used in various applications. Generally, these circuits produce a pulse which has a shorter duration than the system clock pulses input thereto. An example of such a clock chopper is found in the IBM Technical Disclosure Bulletin, Vol. 29, No. 7, Dec. 1986, pp. 3148-3151. The circuit there described includes a receiver circuit coupled to the system clock for generating dual output clock signals. The dual phase output signals couple to the input of a delay generator which is configured from a complementary transistor switch (CTS) memory cell. The time required to write this cell determines the width of the generated pulse. The delay generator is coupled via a level converter circuit to a gate receiver circuit. The gate receiver is also coupled to the system clock input and has a level output so long as both inputs thereto are at a low level.

That clock chopper circuit has at least two unique characteristics. First, the delay generator contributes about 60% to 70% of the total pulse width formed. Second, the select and reset time are nearly identical because the memory cell therein runs symmetrically. As such, the cycle time for the circuit is limited to being greater than the turn on (select) and turn off (reset) time for the cell, the turn on and turn off times being approximately equal. Accordingly, circuits of the type described above are limited to applications where the cycle time is at least as long as the set and reset time of the CTS cell. The circuit simply cannot function faster.

As there is an ever present desire to make circuits used in computers function faster, it is a principal objective of the present invention to make a clock chopper made of transistor elements similar to those described above but configured in a somewhat different manner so as to operate at a higher speed than was achieved with the prior design.

It is a further objective of the present invention to provide a clock chopper circuit whose duty cycle is principally controlled by the turn on and turn off time of a CTS memory cell where the turn on and turn off times are not substantially equal.

BRIEF DESCRIPTION

The present invention is generally configured as the clock chopper described in the above mentioned IBM Technical Disclosure Bulletin. In achieving higher speed operation, however, the delay generator is constructed in a different manner. Principally, the CTS memory cell is configured to be asymmetrical in operation. That is the half of the cell which determines the turn on is operated in saturated mode while the other half which controls the turn off/recovery time is operated in non-saturated mode. This permits the circuit to turn off quicker and to be ready for the next system clock cycle to begin.

DESCRIPTION OF THE DRAWINGS

The above mentioned objects, advantages and features of the present invention are described below in greater detail in connection with the drawings, which form a part of the disclosure, wherein:

FIG. 2 illustrates the circuitry for the asymmetrical delay generator of the present invention.

DETAILED DESCRIPTION OF THE INVENTION

Figure 1A:
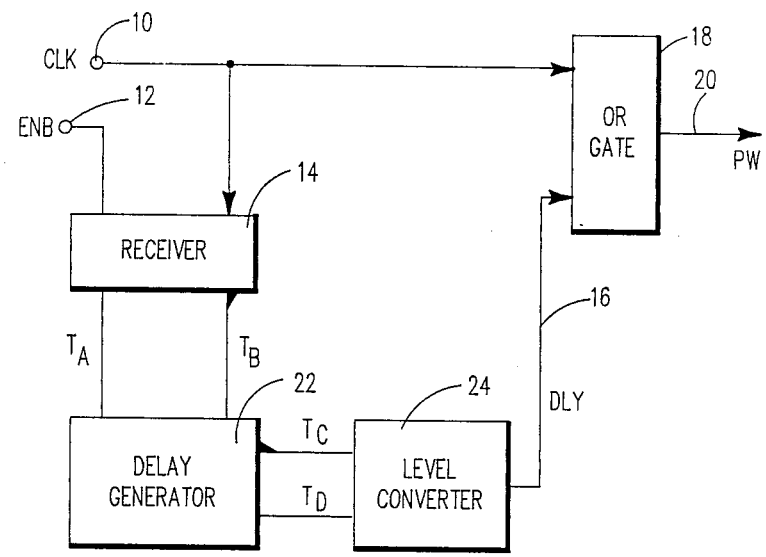
FIG. 1A is a block diagram of the clock chopper of the present invention.

Reference is first made to FIG. 1A which comprises a block diagram of the clock chopper circuit shown in the IBM Technical Disclosure Bulletin, Vol. 29, No. 7, Dec. 1986, pages 3148-3151. The content of that publication is incorporated herein by reference.

The circuit has a clock input terminal 10 for receiving from an external source a clock signal which, in typical applications, comprises a substantially symmetrical square wave signal at a particular frequency. The circuit also includes an enable input terminal 12 for receiving a signal from the external circuitry to either enable or disenable the receiver 14 and other circuitry coupled thereto. When the enable signal at the input terminal 12 is at its enabling state, the receiver 14 is actuated along with the other circuitry coupled thereto to ultimately produce a delayed signal on the line 16 which is input to the OR gate 18. This signal on the line 16 combines with the clock signal from the clock input terminal 10 to produce a clock chopper output signal at the line 20. When the enable signal at the input terminal 12 is in its non-enabling state, however, only the signal appearing at the clock input terminal 10 is passed by the OR gate 18 to the clock chopper output line 20. The enable input terminal 12 and the signals coupled thereto provide a means for either enabling the delay generator circuit of the present invention or disabling it. For the remainder of the discussion, the signal on the enable line 12 will be considered to be in its enabling state.

The receiver circuit 14 is shown in detail in FIG. 2 of the above identified publication which is herein incorporated by reference. The receiver circuit has a pair of output lines labelled $T_A$ and $T_B$.

Figure 3:
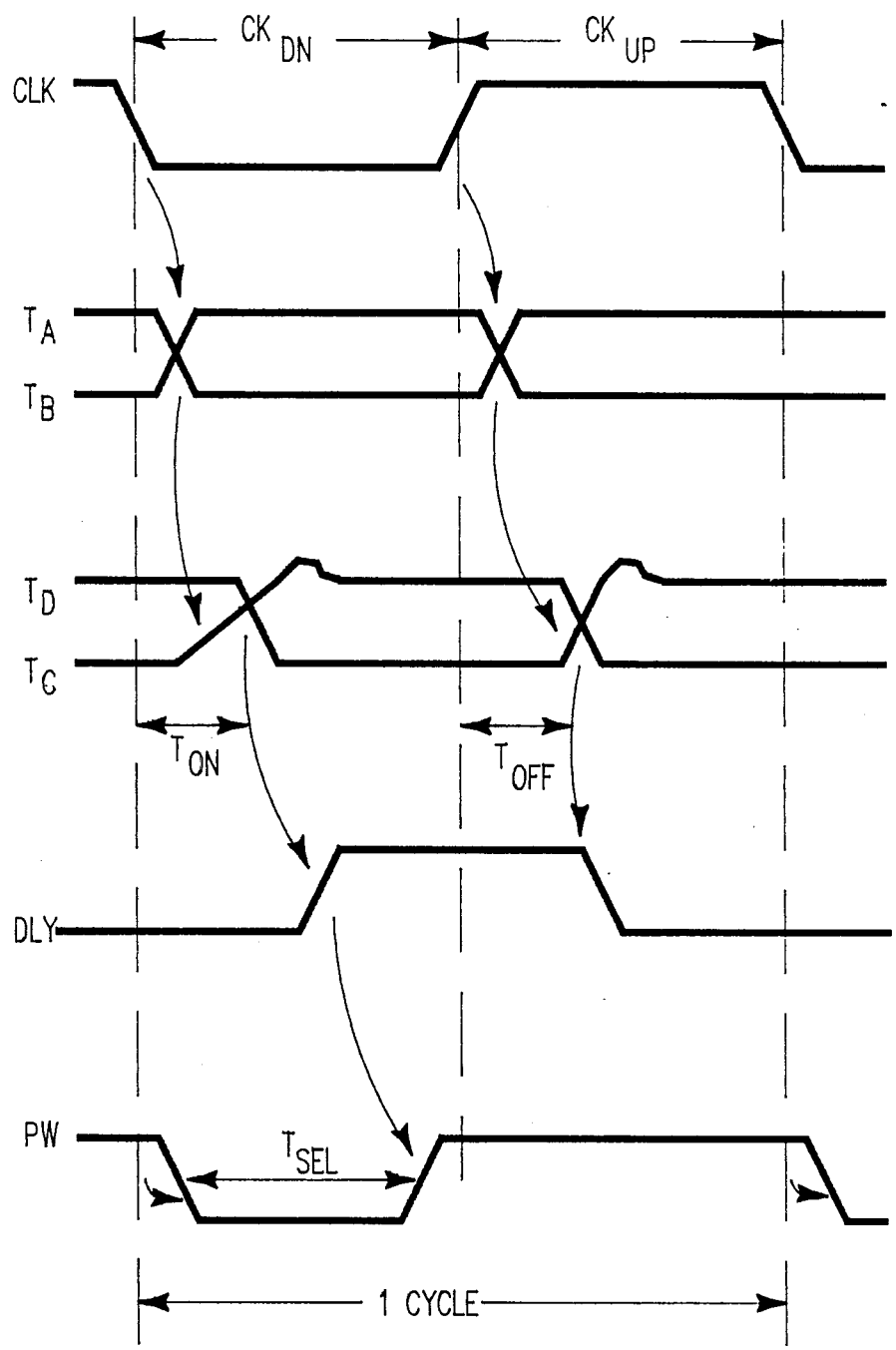
FIG. 3 illustrates the operation of the logic of FIG. 1A with the delay generator of FIG. 2 contained therein.

The receiver output lines $T_A$ and $T_B$ comprise the inputs to the delay generator 22 which, in the above mentioned document which has been incorporated by reference, is illustrated in FIG. 3 thereof. The delay generator produces at its output terminals $T_C$ and $T_D$ signals which are complements of each other and somewhat delayed from those appearing at the input thereto. These delayed signals are coupled to a level converter 24 which subsequently produces on the output lines 16 a signal which is input to the OR gate 18. The level converter 24 is illustrated in FIG. 4 from the above referenced document which has been herein incorporated by reference.

In general, the circuitry of FIG. 1A functions in the following manner. When the leading edge of the clock signal appears at the input terminal 10, that signal is propagated by the OR gate 18 to the output thereby producing the leading edge of the pulse generated thereby. The clock signal is also applied to the receiver 14 which propagates it into the delay generator 22 which produces a state change at the output lines $T_C$ and $T_D$. This state change is sensed by the level converter 24 and an appropriate level signal is placed on the output line 16 and coupled to the OR gate 18. The state change on the line 16 causes the output of the OR gate 18 on line 20 to change back to its original state. Accordingly, the state change in the outputs of the delay generator 22 are responsible for changing the state of the output 20 at a time prior to the time when the state of the clock signal at the clock input terminal 10 itself changes state.

Figure 1B:
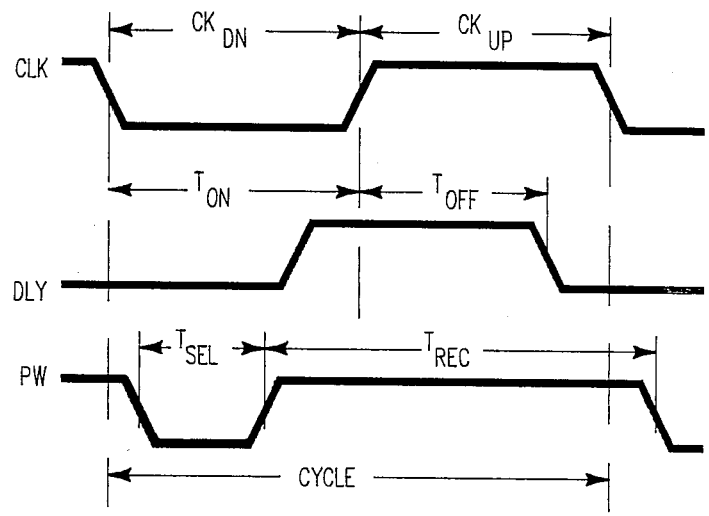
FIG. 1B is a timing pulse diagram for the logic of FIG. 1A which is made in accordance with the circuit diagram in the above mentioned IBM Technical Disclosure Bulletin.

The delay generator circuit 22 includes a complementary transistor switch memory cell which is set to a first state in response to the leading edge of the clock pulse appearing at the clock input terminal 10. It is this state change which ultimately results in a state change appearing on the line 16 which causes the trailing edge of the pulse on line 20 to be created. Once the cell in the delay generator 22 has been set to this state, it must thereafter be reset before the clock chopper of FIG. 1A can again function. This resetting operation is caused by the change in state of the signal appearing at the clock input terminal 10. This state change is propagated by the receiver 14 to the delay generator 22 which thereby causes the output on lines $T_C$ and $T_D$ to change states. This changed state is transmitted to the level converter 24 to produce a signal on the line 16 which will return the signal to its initial state prior to the receipt of the previous clock pulse at terminal 10. Because the delay generator circuit 22 includes a complementary transistor switch memory cell, the time required to return the delay generator 22 to its prior state is a function principally of the time required to reset that memory cell. Since the memory cell in the delay generator as described in the above mentioned document which has been incorporated by reference, operates in saturation, this switching time may be quite substantial compared to the cycle time of the signal appearing at clock input terminal 10. FIG. 1B illustrates the pulses for the lines labelled CLK, DLY and PW in FIG. 1A. The line CLK is the clock line which, during a complete cycle thereof, includes an initial clock down time of $CK_{DN}$ and a clock up time of $CK_{UP}$. The mid point of the leading (falling) edge of the clock down portion defines the beginning of a clock cycle. The output signals PW falls a short time thereafter in response to the clock CLK signal falling at the input to the OR gate 18. As noted above, the receiver 14, the delay generator 22 and the level converter 24 operate to produce a delayed signal at the line DLY which rises in response to a falling signal on the line CLK. The delay associated with the receiver 14, the delay generator 22 and the level converter 24 is illustrated in FIG. 1B as the turn on delay $T_{ON}$. After this turn on delay, the signal on the line DLY rises at the input to the OR gate 18 thereby causing the output line PW to also rise. Hence, the clock pulse on the line PW is altered in shape somewhat of that appearing on the line CLK which is illustrated in FIG. 1B.

At the end of the clock down portion $CK_{DN}$, the level on the line CLK goes from a low to a high level. In response thereto, the receiver 14, the delay generator 22 and the level converter 24 sometime thereafter cause the level on the line DLY to go low. This turn off or reset delay is illustrated by the time $T_{OFF}$ in FIG. 1B. Accordingly, the absolute minimum cycle time which the circuit of FIG. 1A is capable is defined by the equation $Cycle=CK_{DN}+CK_{UP}$ which must be equal to or greater than $T_{ON}+T_{OFF}$. For applications of the present invention in chips having complementary switch transistor memory cells, the portion of the clock signal PW designated as the select time $T_{SEL}$, must be approximately equal to the time required for each memory cell to be set. Accordingly, this portion of the clock cycle cannot be reduced. As such, the only possible approach for speeding the operation of the clock chopper of the present invention is to in some manner reduce the turn off time $T_{OFF}$ thereby causing the signal DLY to go low at an earlier time than has been achieved by the circuitry illustrated in the above mentioned publication which has been incorporated herein by reference.

As has already been noted, it is a principle objective of the present invention to provide a clock chopper circuit which can operate more quickly than clock choppers known in the prior art. In particular, the circuitry illustrated in FIG. 2 is operative to produce a delayed output on the lines $T_D$ and $T_C$ which cause a signal corresponding to the signal DLY of FIG. 1B to have a turn off time $T_{OFF}$ which is considerably shorter than achieved by the prior art in the above referenced publication.

Referring now to FIG. 2, the preferred embodiment of the asymmetrical delay generator of the present invention is shown. This circuit is characterized by having two voltage sources, voltage source $V_{CC}$ and voltage $V_{EE}$. Voltage $V_{CC}$ is approximately $+1.4$ volts while that at supply source $V_{EE}$ is approximately $-2.2$ volts. This circuit includes a first transistor T1 having its base coupled to an input terminal $T_A$, its collector connected to the supply $V_{CC}$ and its emitter coupled to the node 1. A second transistor T2 has its base coupled to the input terminal $T_B$, the collector coupled to the supply $V_{CC}$ and its emitter coupled to the node 2. It should be noted that the input terminals $T_A$ and $T_B$ of the circuit of the present invention are coupled to the TA and TB terminals in FIG. 2 of the IBM Technical Disclosure Bulletin in Vol. 29, No. 7, December 1986, pp. 3148-3151. The signals appearing on these lines are illustrated in FIG. 2 such that the leading edge of the pulse recieved by the asymmetrical delay generator at terminal $T_A$ is falling while the leading edge of that pulse at terminal $T_B$ is rising.

The circuit of FIG. 2 additionally includes a third transistor T3 whose base is also coupled to the terminal $T_A$. The collector thereof is coupled to the base and to a resistor $R_1$ which is disposed between the collector of transistor T3 and the voltage supply $V_{CC}$. A fourth transistor T4 has its base coupled to the input terminal $T_B$. The collector thereof is coupled the base thereof and also to a resistor $R_2$ which is disposed between the collector of transistors T4 and the supply $V_{CC}$. The emitter of transistor T3 is coupled to a Schottky diode S1 which is disposed between the emitter of transistor T3 and the node 2. The emitter of the transistor T4 is coupled to a second Schottky diode S2 which is disposed between the emitter of tranisistor T4 and the node 1.

The circuit of FIG. 2 additionally includes a resistor R3 coupled between node 1 and the voltage supply $V_{EE}$. A further resistor R4 is coupled between node 2 and the voltage supply $V_{EE}$.

The circuitry of FIG. 2 additionally includes a complementary transistor switch memory cell having a right half RH and a left half LH each of which comprises a pair of transistors each coupled together in an SCR configuration. The first pair of transistors comprises transistors PR and NR and the second pair comprises the pair of transistors PL and NL. The transistor PR has its emitter coupled through a resistor $R_p$ to the supply $V_{CC}$. The base of the transistor PR is coupled via a Schottky diode SR to the node 2 and also to the collector of transistor NR. The collector of the transistor PR is coupled to the base of the transistor NR. The base of the transistor NR is also coupled to the output terminal $T_D$ as well as to the collector of the transistor NL.

The transistor PL has its emitter coupled to the voltage supply $V_{EE}$. The base thereof is coupled by a Schottky diode SL to node 1. In addition, the base of the transistor PL is coupled to the collector of transistor NL, the base of the transistor NR and the output terminal $T_D$. The collector of transistor PL is coupled to the base of the transistor NL which is further coupled to the collector of transistor NR and the output terminal $T_C$. The connection between the collector of transistor PL and the base of transistor NL is coupled via a Schottky diode SS to the connection between the base of transistor PL and the collector of transistor NL. The emitter of transistor NL and transistor NR are both coupled directly to the voltage supply $V_{EE}$.

The operation of the circuitry of FIG. 2 will now be described in connection with the pulse diagram of FIG. 3.

Functionally, the circuitry of FIG. 2 operates in the following manner. As previously mentioned, the input signals to the circuitry of FIG. 2 at terminals TA and TB are received from the receiver 14 which has been described in the IBM Technical Disclosure Bulletin, Vol. 29, No. 7, December 1986, pp. 3148-3151. That circuitry responds directly to a clock signal CLK, as illustrated in FIG. 3 which has a down portion $CK_{DN}$ and an up portion $CK_{UP}$. Each clock cycle comprises the sum of the time $CK_{DN}$ plus $CK_{UP}$. The change in the state of the CLK signal from its up to its down state comprises the beginning of the clock cycle. In response to this transition, the receiver 14 produces a signal on the line TA which, sometime thereafter, changes from its up to its down state. In a similar fashion, the signal on the line TB transitions from its low to its high state in response to the clock signal CLK falling from its high to its low state. This is illustrated in FIG. 3.

The circuitry of FIG. 2 includes transistors $T_1$ and $T_2$ which comprise emitter follower circuits which are used to write the CTS cell. Transistors $T_3$ and the Schottky diode $S_1$ form a cross-coupled feed back loop with transistor $T_4$ and Schottky $S_2$ to control the writing of the cell. Resistors $R_1$ and $R_2$ base drive current for the emitter followers $T_1$ and $T_2$ whereas the resistors $R_3$ and $R_4$ provide current pull-down on the nodes 1 and 2.

The CTS cell contains two cross-coupled SCR devices each configured of a PNP and NPN transistor in an SCR connection. The two halves of the cell function differently. The right half of the cell, namely diode SR and transistors PR and NR determine the turn on delay. That is, these elements determine the time between the state change on the lines TA and TB and when the signal at the output terminal TC completes its transition from a low to a high state. The right half of the cell is powered by a voltage supply $V_{CC}$ through a resistor RP. The value of that resistor can be changed to adjust the operating current level for the right half of the cell. That portion of the cell is switched from an on to an off state by driving transient current into the collector of the transistor NR from the emitter follower $T_2$ and the Schottky diode SR. The time required to write this half-cell is a function of the SCR current level prior to its being written, the magnitude of the transient write current and the SCR device parameters such as the saturation capacitance $C_{CB}$ and the beta for the NPN transistor, etc. This turn on time is illustrated in FIG. 3 by the voltage $T_C$ rising from its low to its high state. Once this voltage reaches a given threshold voltage, the state of the voltage on the line $T_D$ to fall so that it reaches its down state at substantially the same time as the voltage on the line $T_C$ its up state.

In response to the signals on the lines $T_D$ and $T_C$ changing state at the conclusion of the turn on time $T_{ON}$, the signal on the line DLY at the output of the level converter 24 goes from a low to a high state. As this signal is input to the OR gate 18 of FIG. 1A, this causes the output on line PW to also go from its low to its high state. As has already been pointed out, this turn on delay is ideally correlated to the time for the circuits coupled to the signal on the line PW to respond to the lock pulse thereon and have their state change, if such state change is called for. In the case of the application for the present invention which is for clocking a memory array, the speed of the circuitry within the delay generator is approximately that for the speed of writing the memory circuits coupled thereto.

As the delay generator of FIG. 1 has a memory cell in it, it must be reset before the beginning of the next clock cycle in order to be able to properly produce the output which will control the signal on the line PW. To accomplish this, as has already been pointed out, the circuit responds to the state change of the clock signal CLK going from its down to its up state to thereby cause the resetting of the cell within the delay generator circuit. The transition of the clock signal CLK from its down to its up state, causes the receiver 14 to produce a change in the state of the signals on the lines TA and TB. This state change is responded to by the delay generator to produce a state change on the lines TC and TD thereby causing the signal DLY to go from its up to its down level. The turn off delay $T_{OFF}$ is determined by the circuit elements SL, PL and NL. The left half of the cell, however, differs from the right half of the cell in two significant respects. In the first place, there is a Schottky diode coupled between the connection between the line coupling the collector of transistor PL to the base of transistor NL and the line coupling between the base of the transistor PL and the collector of the transistor NL. This prevents the SCR circuit including transistors PL and NL from operating in saturation. The second difference between the left and the right half of the cell is that the transistor PL is shut off to thereby reduce the storage charged within the SCR. These two changes enable the left half of the cell to be written more quickly than the right half thereby causing the state change on the lines TC and TG to occur more quickly after the change in the state on the clock line CLK, i.e., the time $T_{OFF}$ is less than the $T_{ON}$.

In response to the change in state on the lines TD and TC, the level converter 24 causes the output line DLY to go from its high to its low state which occurs, as illustrated in FIG. 3 well before the end of the cycle. Consequently, the delay generator of the present invention would allow the cycle time for the clock CLK to be reduced to a point where the next cycle could begin just after the time when the signal on the line DLY gone from its high to its low state. As the turn off $T_{OFF}$ is quicker for the present circuit than can be achieved by the above mentioned prior art circuit, this means that the circuit of the present invention can function at a higher speed than the circuit illustrated in the prior art.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

What is claimed is:

1. In a clock chopping circuit including a system clock input coupled to one input of an OR gate and to a delay generator, the delay generator output being coupled to a second input to said OR gate, the output of said OR gate comprising a chopped clock signal, the delay generator comprising, in combination:

a complementary transistor switch memory cell having a right half and a left half, said right half and said left half each including two transistors of opposite conductivity type connected to normally operate in a regenerative fashion, said right half of said cell which causes the output thereof to switch to a first state from a second state in response to a state change from a first to a second clock state of said system clock being operated in saturation mode, said saturation mode being achieved by driving a saturation current through the transistors of said right half when they are conducting; and said left half of said cell which causes the output thereof to switch from said first state to said second state in response to a change of said system clock from said second to said first state being operated outside of saturation mode, said outside of saturation mode being achieved by including means for biasing one transistor in said left half to be always non-conductive and by a clamp means connected across the base-collector junction of the other transistor in said left half to assure the base-emitter voltage input never becomes high enough to cause saturation of said other transistor in said left half.

2. The delay generator of claim 1 wherein said clamp circuit comprises a Schottky diode.

3. The delay generator of claim 1 wherein said two transistors in said right half and said left half each comprises a PNP and an NPN transistor pair with the base of each transistor in each said pair being coupled to the collector of the transistor in the other transistor in the same said pair.

4. In a clock chopping circuit including a system clock input coupled to one input of an OR gate and to a delay generator, the delay generator being coupled to a second input to said OR gate, the output of said OR gate comprising a chopped clock signal, the delay generator comprising, in combination:

a first and a second input terminal ($T_A$ and $T_B$);

a first and second internal terminal (1 and 2);

a first voltage source ($V_{CC}$), and a second voltage source ($V_{EE}$);

a first and a second transistor ($T_1$ and $T_2$), the collector of said first and said second transistor being coupled to said first voltage source ($V_{CC}$), the base of said first transistor being coupled to said first input terminal ($T_A$) and the emitter of said first transistor being coupled to said first internal terminal (1), the base of said second transistor being coupled to said second input input terminal ($T_B$) and the emitter of said second transistor being coupled to said second internal terminal (2);

a first and a second pull up resistor ($R_1$ and $R_2$);

a third and a fourth transistor ($T_3$ and $T_4$), the base and the collector of said third transistor ($T_3$) being coupled to the base of said first transistor ($T_1$) and the base and collector of said fourth transistor ($T_4$) being coupled to the base of said second transistor ($T_2$);

said first resistor ($R_1$) is coupled between said first voltage source ($V_{CC}$) and the collector of said third transistor ($T_3$), said second resistor ($R_2$) is coupled between said first voltage source ($V_{CC}$) and the collector of said fourth transistor ($T_4$);

a first Schottlky diode coupled between the emitter of said third transistor ($T_3$) and said second internal terminal (2) and a second Schottky diode coupled between the emitter of said fourth transistor ($T_4$) and said first internal terminal (1);

a third and a fourth resistor ($R_3$) and ($R_4$), said third resistor ($R_3$) being coupled between said first internal terminal (1) and said second voltage source ($V_{EE}$) and said fourth resistor ($R_4$) being coupled between said second internal terminal (2) and said second voltage source ($V_{EE}$);

a fifth and a sixth transistor of opposite conductivity type coupled together in an SCR configuration wherein the base of each transistor is coupled to the collector of the other transistor;

a seventh and eighth transistor of opposite conductivity type coupled together in an SCR configuration wherein the base of each transistor is coupled to the collector of the other transistor;

the base of said fifth transistor being coupled by a diaode to said first internal termial (1) and the base of said seventh transistor being coupled by a diode to said second internal terminal (2);

means coupling the collector of said sixth transistor to the base of said eighth transistor, said coupling means being connected to a first output terminal;

means coupling the collector of said eighth transistor to the base of said sixth transistor, the base of said sixth transistor being connected to a second output terminal;

a resistor coupled between the emitter of said seventh transistor and said first voltage source ($V_{CC}$);

means coupling said second voltage source ($V_{EE}$) to the emitter of said sixth transistor and also to the emitter of said eighth transistor;

means coupling the emitter of said fifth transistor to said second voltage source ($V_{EE}$); and a Schottky diode coupled between the collector of said fifth transistor and the collector of said sixth transistor.

* * * * *